(12) United States Patent
Lui

(10) Patent No.: US 10,134,456 B1
(45) Date of Patent: *Nov. 20, 2018

(54) CONTEXT-ADAPTIVE BINARY ARITHMETIC DECODER WITH LOW LATENCY

(71) Applicant: Ambarella, Inc., Santa Clara, CA (US)

(72) Inventor: Beng-Han Lui, Santa Clara, CA (US)

(73) Assignee: Ambarella, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/690,694

(22) Filed: Aug. 30, 2017

Related U.S. Application Data

(63) Continuation of application No. 13/937,409, filed on Jul. 9, 2013, now Pat. No. 9,773,536.

(51) Int. Cl.
*G11C 8/10* (2006.01)

(52) U.S. Cl.
CPC ...................... *G11C 8/10* (2013.01)

(58) Field of Classification Search
CPC ....................................................... G11C 8/10
USPC ....................................................... 375/240.1
See application file for complete search history.

(56) References Cited

U.S. PATENT DOCUMENTS

| | | | |
|---|---|---|---|
| 2007/0296613 A1 | 12/2007 | Hussain | 341/50 |
| 2009/0232205 A1* | 9/2009 | Chiba | H03M 7/4006 |
| | | | 375/240.02 |
| 2009/0273491 A1 | 11/2009 | Sakaguchi | 341/51 |
| 2009/0304075 A1* | 12/2009 | Ogura | H04N 19/70 |
| | | | 375/240.12 |
| 2010/0254620 A1 | 10/2010 | Iwahashi | 382/233 |
| 2011/0255602 A1 | 10/2011 | Kondo | 375/240.16 |

* cited by examiner

*Primary Examiner* — Anner N Holder
*Assistant Examiner* — Hesham K Abouzahra
(74) *Attorney, Agent, or Firm* — Christopher P. Maiorana, PC

(57) ABSTRACT

An apparatus includes a memory and a circuit. The memory may be configured to store a plurality of context variables. The circuit may be configured to (i) generate a select signal that identifies a prediction of a plurality of next states in each of a plurality of next cycles that follow a current cycle of an arithmetic decode of an input signal, (ii) generate a prefetch signal in the current cycle in response to the select signal, (iii) prefetch in parallel from the memory two or more of the context variables suitable to use in the next states in two or more of the next cycles based on the prefetch signal and (iv) generate an output signal by decoding the input signal based on the two or more of the context variables.

20 Claims, 4 Drawing Sheets

CONTEXT-ADAPTIVE BINARY ARITHMETIC DECODER WITH LOW LATENCY

This application relates to U.S. Ser. No. 13/937,409, filed Jul. 9, 2013, which is incorporated by reference in its entirety.

FIELD OF THE INVENTION

The present invention relates to video decoders generally and, more particularly, to a context-adaptive binary arithmetic decoder with low latency.

BACKGROUND OF THE INVENTION

Referring to FIG. 1, a diagram of a conventional context-adaptive binary arithmetic decoder 80 is shown. An arithmetic decoder performs a read-modify-write on context variables stored in a single-port context memory. Due to the delays internal to the memory, read data is registered in output flip-flops before being presented back to the arithmetic decoder. Therefore, a two-cycle latency commonly exists between when a read address is decided by the arithmetic decoder and when the context data is available to the arithmetic decoder. However, the next read address depends on a current decoded binary value, at least indirectly through a current state and neighbor data. The two-cycle latency thus prevents the arithmetic decoder from running at full speed. A single binary value is decoded every other cycle because the next context variable is not immediately available after decoding the current binary value. If the next read address depends directly on the current decoded binary value, which happens from time to time, a state machine inserts two wait cycles. Otherwise, a timing path 82 from the output flip-flops in the context memory, through the arithmetic decoder and back to the address port of the context memory usually prevents timing closure. The timing closure issue is further troubled by longer setup times on the address port of the context memory than the setup time on the data port of output flip-flops.

It would be desirable to implement a context-adaptive binary arithmetic decoder with low latency.

SUMMARY OF THE INVENTION

The present invention provides an apparatus including a memory and a circuit. The memory may be configured to store a plurality of context variables. The circuit may be configured to (i) generate a select signal that identifies a prediction of a plurality of next states in each of a plurality of next cycles that follow a current cycle of an arithmetic decode of an input signal, (ii) generate a prefetch signal in the current cycle in response to the select signal, (iii) prefetch in parallel from the memory two or more of the context variables suitable to use in the next states in two or more of the next cycles based on the prefetch signal and (iv) generate an output signal by decoding the input signal based on the two or more of the context variables.

The objects, features and advantages of the present invention include providing a context-adaptive binary arithmetic decoder with low latency that may (i) reduce a latency in decode operations, (ii) decode a new binary value in each cycle, (iii) incorporate a context memory having a multiple-cycle delay, (iv) prefetch multiple context variables from the context memory several cycles in advance, (v) buffer the prefetched multiple context variables simultaneously, (vi) minimize a number of wait states during the decode operations and/or (vii) be implemented as an integrated circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention provide a context-adaptive binary arithmetic code (e.g., CABAC) decoder configured such that a single binary value (e.g., a logical 0 or a logical 1) is decoded in each process (or clock) cycle to minimize a number of inserted wait states. Access to the context variable may have a low latency to permit the decode rate of a single binary value per cycle. The context variables are stored in a memory and read in sets (or groups) of several variables at time. Each set is latched at a data output in multiple slots of an output buffer. Access to the context variables generally has a multi-cycle latency (e.g., a 2-cycle latency) from an address input port to an output data port of the memory. Therefore, all or most context variables that may be used N cycles (e.g., 2 cycles) later are prefetched as far as the output buffer. At any given state, the next context variables that should be used in the decoding may reside in one or more slots of the output buffer.

Figure 1:
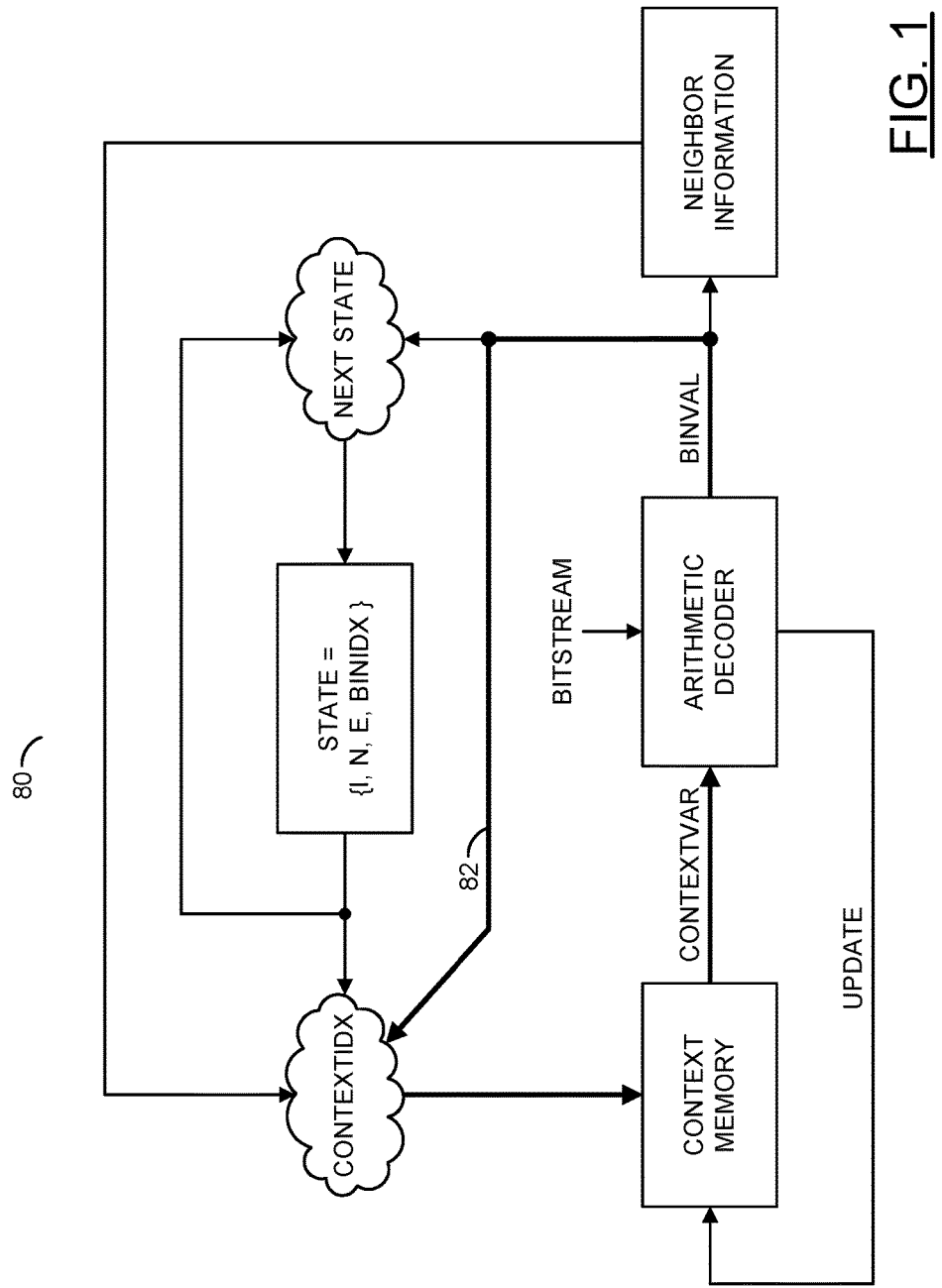
FIG. 1 is a diagram of a conventional context-adaptive binary arithmetic decoder.
Figure 2:
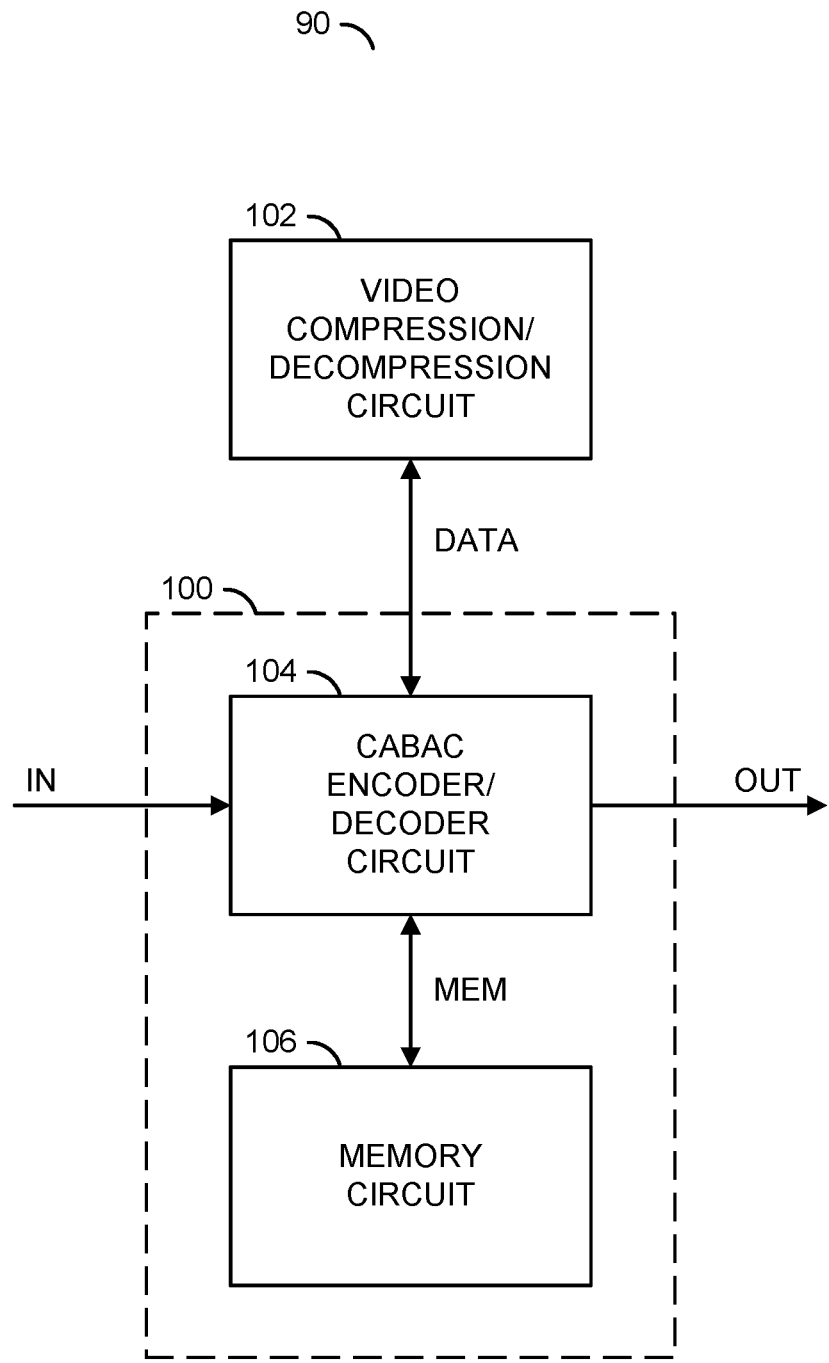
FIG. 2 is a block diagram of an example implementation of an apparatus in accordance with a preferred embodiment of the present invention.

Referring to FIG. 2, a block diagram of an example implementation of an apparatus 90 is shown in accordance with a preferred embodiment of the present invention. The apparatus 90 generally implements a video encoder/decoder circuit. The apparatus 90 generally comprises a block (or circuit) 100 and a block (or circuit) 102. The circuit (or apparatus or device or integrated circuit) 100 may implement an entropy coder circuit. The circuit 100 generally comprises a block (or circuit) 104 and a block (or circuit) 106. The circuits 100 to 106 may be implemented in hardware, software, firmware or any combination thereof in an apparatus. In some embodiments, the apparatus 90 may be a digital video camera, a digital still camera or a hybrid digital video/still camera.

An input signal (e.g., IN) may be received by the circuit 104. The signal IN generally conveys encoded video syntax elements and encoded data in an input bitstream where the apparatus 90 is decoding video. An output signal (e.g., OUT) may be generated and presented by the circuit 104. The signal OUT generally conveys the encoded syntax elements and the encoded data in an output bitstream where the apparatus 90 is encoding the video. A bidirectional signal (e.g., DATA) may be exchanged between the circuit 102 and the circuit 104. The signal DATA generally conveys compressed syntax elements and compression data. The compressed syntax elements and the compressed data may be generated by the circuit 102 and transferred to the circuit 104 where the apparatus 90 is encoding the video. The compressed syntax elements and the compressed data may be generated by the circuit 104 and transferred to the circuit 102 where the apparatus 90 is decoding the video. A bidirectional signal (e.g., MEM) may be exchanged between the circuit 104 and the circuit 106. The signal MEM generally transfers data that is used by and is created during entropy encoding operations and/or entropy decoding operations.

The circuit 102 may implement a video compression/decompression circuit. The circuit 102 is generally operational to compress raw video in an encode mode to generate the compressed syntax elements and compressed data. The compressed syntax elements and the compressed data are generally transferred to the circuit 104 in the signal DATA for entropy encoding. In a decode mode, the circuit 102 may be operational to reconstruct the video from the compressed syntax elements and the compressed data received from the circuit 104 via the signal DATA. The video compression/decompression operations may be compliant with one or more of MPEG-2, H.264 and/or a high efficiency video coding (e.g., HEVC) draft standard (e.g., JCTVC-H1003 by the Joint Collaborative Team on Video Coding of ITU-T SG16 WP3 and ISO/IEC JTC1/SC29/WG11). Other video codecs may be implemented to meet the criteria of a particular application.

The circuit 104 generally implements an entropy encoder/decoder circuit. In the encode mode, the circuit 104 is generally operational to entropy encode the compressed syntax elements and compressed data generated by the circuit 102 and transferred in the signal DATA. The entropy encoded information may be presented in the signal OUT. In the decode mode, the circuit 104 may be operational to entropy decode the encoded syntax elements and encoded data received in the signal IN. The resulting compressed syntax elements and the compressed data may be transferred in the signal DATA to the circuit 102 to perform decompression operations and recreate the raw (or original) video. The circuit 104 is also operational to communicate with the circuit 106 via the signal MEM to write and read information used during the entropy encode operations and the entropy decode operations. In some embodiments, the circuit 104 may implement an arithmetic code. In some embodiments, the circuit 104 may implement a context-adaptive binary arithmetic code.

While encoding or decoding, the circuit 104 may be configured to predict multiple next states in each of a plurality of next cycles that follow a current cycle of an entropy codec operation. The circuit 104 may also be configured to encode/decode a plurality of next binary values in each respective next cycle and subsequently write updated context variables (e.g., read-modify-write) into the circuit 106. The encode/decode operations may work on a binary value per cycle because the circuit 106 generally provides appropriate context variables at the start of each new cycle with no apparent latency, as seen by the circuit 104.

The circuit 106 may implement a memory circuit. In some embodiments, the circuit 106 may implement a static random-access memory (e.g., SRAM). Other memory technologies may be implemented to meet the criteria of a particular application. The circuit 106 is generally operational to store context variables used in the CABAC operations performed by the circuit 104. The context variables may be stored in memory cells such that a set (or group) of multiple context variables is accessed in parallel (or simultaneously or at the same time). The set of context variables may be loaded from the memory cells into respective slots in the output buffer. The output buffer is generally sized to hold a number (e.g., 6 to 12) context variables sufficient for coding several possible states in the later (or next few) cycles. Buffering the context variables for several (e.g., N) cycles generally hides a latency to read from the memory cells in support of the CABAC operations. When one or more next context variables are determined by the circuit 104, pick logic in the circuit 106 may read a selected one or more of the context variables from the buffer slots and route the appropriate context variables to the circuit 104 via the signal MEM.

Figure 3:
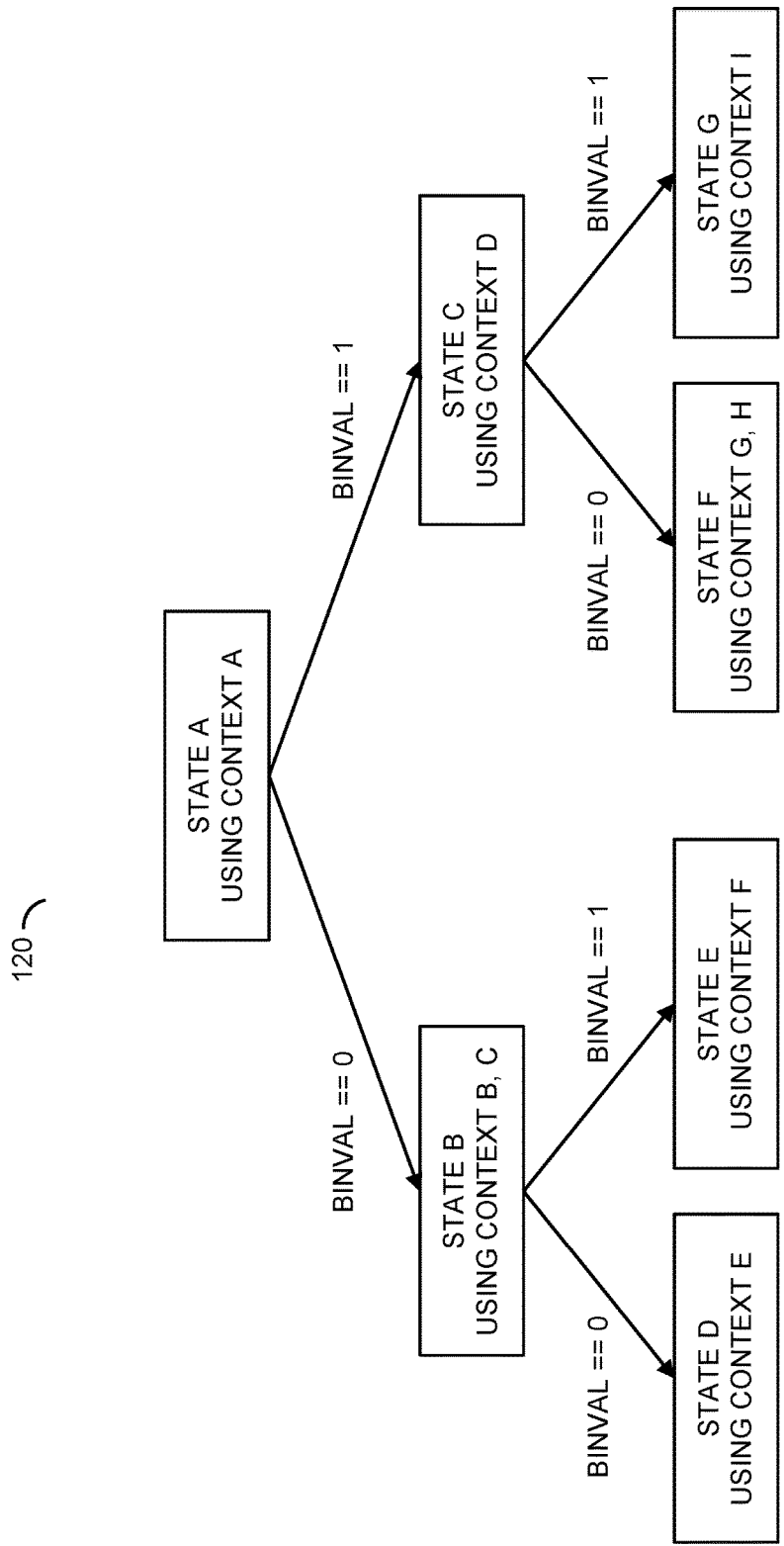
FIG. 3 is a state transition diagram of an example decode.

Referring to FIG. 3, a state transition diagram 120 of an example decode is shown. The example may start from a state A in which a binary value (e.g., BINVAL) is decoded using a context A. Depending on the decoded binary value, the diagram 120 may transition to either a state B if the just-decoded binary value is zero, or a state C if the just-decoded binary value is one.

At the state B, the diagram 120 may transition to either a state D or a state E, depending on a subsequent binary value decoded in the state B. Likewise, the diagram 120 may transition from the state C to either a state F or a state G, depending on a subsequent binary value decoded in the state C. Therefore, the context variables (e.g., context B-I) that may be used over the next N (e.g., 2) cycles are knowable at the state A. What is uncertain is which among the states E-G and thus which among the context variables E-I will be appropriate N cycles later.

The states B-I may be predicted while in state A based on the video codec. For example, section 7.3.7 of the HEVC draft standard generally provides Mode Inter prediction unit syntax as follows:
merge_flag[x0][y0]
  if(merge_flag[x0][y0]){
  if(MaxNumMergeCand>1)
    merge_idx[x0][y0]
  }else{
    if(slicetype==B)
      inter_pred_idc[x0][y0]
    if(inter_pred_idc[x0][y0] !=PRED_L1){
      if(num_ref_idx_l0_active_minus1>0)
        ref_idx_l0[x0][y0]
      mvd_coding(x0,y0,0)
      mvp_l0_flag[x0][y0]
  }
When decoding merge_flag, the next syntax element may be merge_idx or inter_pred_idc, or refidx_l0, or mvd_coding.

To account for the uncertainty, the circuit 104 generally prefetches the context variables E-I such that the context variables E-I will be ready and available for decoding N cycles later. If any of the context variables E-I are not already in the output buffer of the circuit 106 at the state A, a memory read cycle for prefetching the missing context variables may be issued by the circuit 104 because the read latency of the context variable storage is N cycles.

Figure 4:
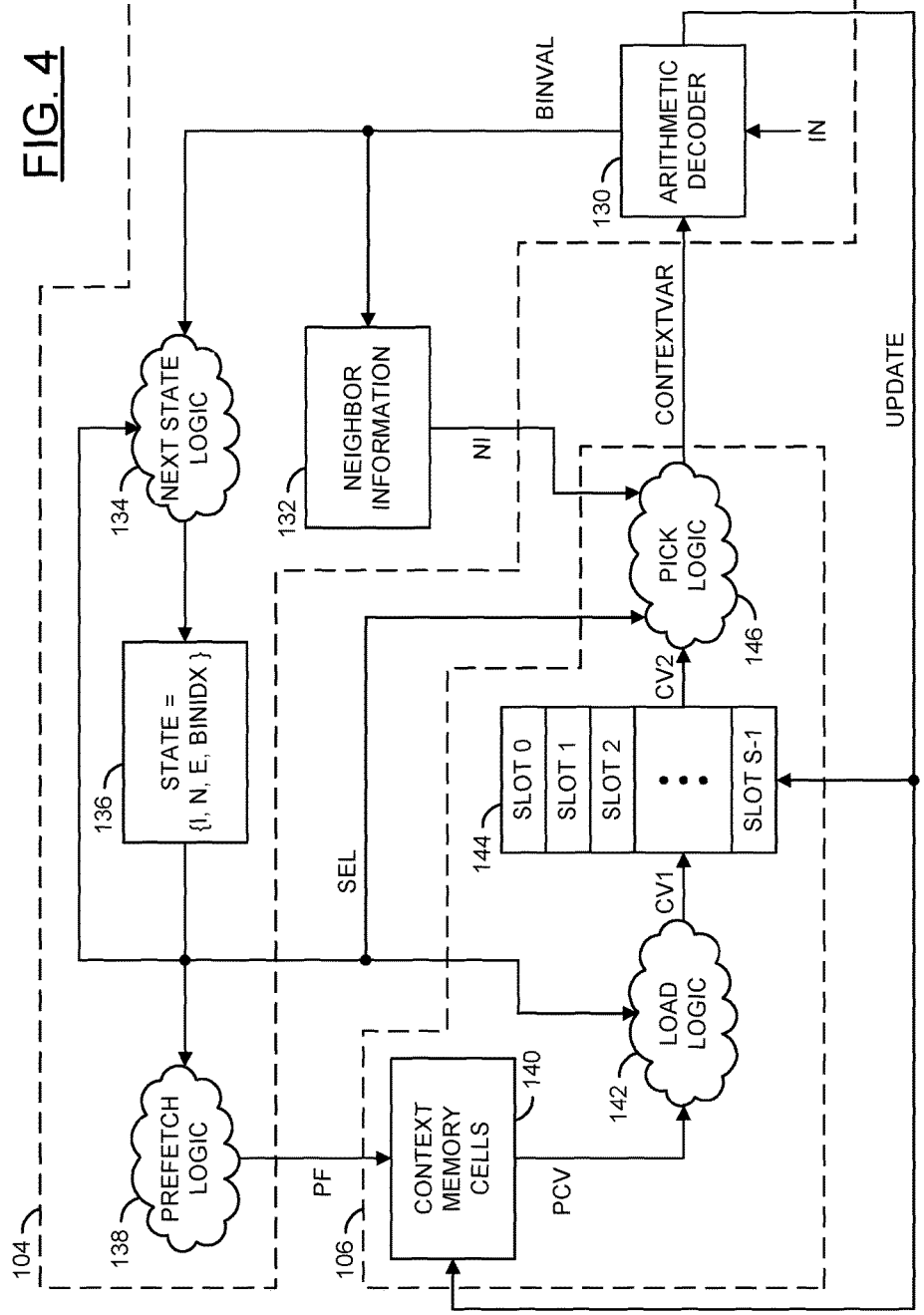
FIG. 4 is a diagram of an example implementation of a decoder circuit and a memory circuit of the apparatus.

Referring to FIG. 4, a diagram of an example implementation of the circuits 104 and 106 is shown. The circuits 104 and 106 are generally described performing decode operations. Encode operations may be similar with the entropy decode operations replaced by entropy encode operations.

The circuit 104 generally comprises a block (or circuit) 130, a block (or circuit) 132, a block (or circuit) 134, a block (or circuit) 136 and a block (or circuit) 138. The circuit 106 generally comprises a block (or circuit) 140, a block (or circuit) 142, a block (or circuit) 144 and a block (or circuit) 146. The circuits 130 to 146 may be implemented in hardware, software, firmware or any combination thereof in an apparatus. In some embodiments, one or more of the circuits 142, 144 and/or 146 may be part of the circuit 104 and/or stand-alone circuits.

The signal IN may be received by the circuit 130. A signal (e.g., BINVAL) may be generated by the circuit 130 and transferred to the circuits 132 and 134. The signal BINVAL generally carries the binary value decoded in each cycle. The circuit 132 may generate a signal (e.g., NI) received by the circuit 146. The signal NI generally conveys neighbor information used to help determine the one or more context variables for a next cycle. A signal (e.g., SEL) may be generated by the circuit 136 and transferred to the circuits 134, 138, 142 and 146. The signal SEL may contain selection information used to select the context variables of the next N cycles. A signal (e.g., PF) may be generated by the circuit 138 and presented to the circuit 140. The signal PF may be a prefetch command to begin a prefetch operation. A signal (e.g., CONTEXTVAR) may be generated by the circuit 146 and transferred to the circuit 130. The signal CONTEXTVAR generally carries the context variables selected by the circuit 146. A signal (e.g., UPDATE) may be generated by the circuit 130 and presented to the circuits 140 and 144. The signal UPDATE may contain updated context variables calculated by the circuit 130. The signals PF, SEL, NI, CONTEXTVAR and UPDATE may be implemented as components of the signal MEM (FIG. 2) between the circuits 104 and 106.

The circuit 140 generally presents the prefetched context variables in a signal (e.g., PCV) to the circuit 142. A signal (e.g., CV1) may be generated by the circuit 142 and transferred to the circuit 144. The signal CV1 generally routes the prefetched context variables from the circuit 140 to corresponding slots in the circuit 144. A signal (e.g., CV2) may be generated by the circuit 144 and presented to the circuit 146. The signal CV2 may convey one or more context variables read from the circuit 144. The just-read context variables may be presented in the signal CONTEXTVAR from the circuit 146 to the circuit 130.

The circuit 130 may implement an arithmetic decoder circuit. The circuit 130 is generally operational to entropy decode the encoded syntax elements and encoded data received in the signal IN to determine a binary value in each successive cycle. The decoded binary value may be presented in the signal BINVAL to the circuits 132 and 134. Updated context variables may be presented in the signal UPDATE to the circuits 140 and/or 144.

The circuit 132 may implement a neighbor information circuit. The circuit 132 is generally operational to store neighboring pixel information. The video compression standards sometimes have a choice of context variables depending on the previously decoded syntax elements. In some situations, the previously decoded syntax elements may be the syntax elements related to the neighboring pixels, such as a top neighboring pixel and/or a left neighboring pixel. The circuit 132 generally stores the neighbor pixel information.

The circuit 134 may implement next state logic. The circuit 134 is generally operational to decide what is in the next state. Referring again to Section 7.3.7 of the HEVC draft standard, when decoding a merge_flag syntax element several other syntax elements may be decoded. For example, a merge_flag, a MaxNumMergeCand, which is decoded from a header part of a video sequence, a slice_type, which may also be in the header, and a num_ref_idx_l0_active_minus1 syntax elements, also in the header, may be decoded to decide which is the next syntax element. Sometimes a syntax element has multiple binary values. In such a case, a binIdx may also be referenced.

The circuit 136 may implement a state machine circuit. The circuit 136 is generally operational to predict the possible states in the next N decode cycles. The possible states may be identified in the signal SEL. The identifications are presented to the circuits 138, 142 and 146.

The circuit 140 may implement an array of memory cells. The circuit 140 is generally operational to store the context variables used in the entropy encoding/decoding operations. The context variables may be presented as sets of multiple (e.g., 6 to 12) values at a time in the signal PCV in response to the prefetch command of the signal PF. The context variables are generally grouped in individual data words such that the possible variables that could be used N cycles later are prefetched together in the same cycle.

The circuit 142 may implement load logic. The circuit 142 is generally operational to route each set (or data word) of context variables received from the circuit 140 to appropriate slots in the circuit 144. The routing may be based on the signal SEL.

The circuit 144 may implement a buffer circuit. The circuit 144 generally has multiple slots (e.g., SLOT 0 to SLOT S−1) in which to store the context variables prefetched from the circuit 140. The context variables may be loaded into the respective slots by the circuit 142 via the signal CV1, a single context variable per slot. The updated context variables may also be loaded into the slots by the circuit 130 via the signal UPDATE. One or more selected context variables may be read at a time from the circuit 144 by the circuit 146 in the signal CV2.

The circuit 146 may implement pick logic. The circuit 146 is generally operational to pick (or select) one or more of the context variables to read from the circuit 144. The selection is generally based on the information in the signals SEL and NI. Every binary value is generally associated with a context variable based on the state variables and the neighbor information. The associations may be specified in the video compression standard. By combining the standard associations with the knowledge of which context variable is in which slot, the circuit 146 may identify the appropriate context variables from the appropriate slots in the circuit 144. The selected context variables may be transferred from the circuit 146 to the circuit 130 in the signal CONTEXTVAR.

The circuit 144 may be configured to meet several criteria. The circuit 144 generally has a sufficient number of buffer slots to hold all or most possible context variables that may be used in the next N cycles. The number of slots may be determined by incrementally inspecting each state in the decoding process and checking for all branches leaving the current state. The number of unique context variables possible in the next N cycles may be counted. The circuit 144 may be subsequently designed with enough buffer slots to hold up to some reasonable number of context variables. If the reasonable number is less than a maximum possible number of potential context variables, wait states may be implemented in the circuit 104 to account for any context variables that were not prefetched due to a lack of available slots.

An example situation where one or more wait states may be implemented is a WAIT_AFTER_MVD state inserted after decoding all H.264 motion vector differences (e.g., MVD) and before decoding a coded block pattern (e.g., CBP). A first state for a last motion vector difference x-component (e.g., MVDX) syntax element may be prefetched and generally holds 4 context variables for the motion vector difference x-component, 4 context variables for a motion vector difference y-component (e.g., MVDY) and 4 context variables for a luminance coded block pattern (e.g., CBP_LUMA). If 12 buffer slots in the circuit 144 for the 12 MVD context variables are determined to be too many to buffer together, a single wait state may be inserted per macroblock. While in the MVDX states, only eight buffer slots of the circuit 144 may be utilized simultaneously, the 4 buffer slots for the MVDX context variables and the 4 buffer slots for the MVDY context variables. The 4 context variables for the CBP_LUMA state may be prefetched in the MVDY state and the 4 MVDX context variables may be evicted from the circuit 144 to make room. Therefore, the circuit 144 may be implemented with 8 buffer slots in the example.

A width of each data word in the circuit 140 may be wide enough to allow prefetching all of the context variables that may be used in the next N cycles. If in the incremental inspection process a situation arises to prefetch more context variables than a single data word can hold, an option may be to implement wider data words with more memory cells in the circuit 140 and a wider signal PCV. Another option may be to prefetch earlier where enough room is available in the circuit 144.

In an example involving entropy decoding operations per the HEVC draft standard, a WAIT_IF_NO_TT state may be inserted after decoding an RQT_ROOT_CBF syntax element if a result is zero. Without such a wait state, no certainty may exist whether a transform_tree( ) syntax element will be present or not from the RQT_ROOT_CBF syntax element. Therefore, the circuit 104 may prefetch 7 context variables for both a CBF_CB state and a SPLIT_CU_FLAG state. Now consider a situation where the data width of the circuit 140 is limited to 6 context variables per word. The context variables for the CBF_CB state may be prefetched while in the RQT_ROOT_CBF state. Thereafter, the context variables for the SPLIT_CU_FLAG state may be prefetched while in the WAIT_IF_NO_TT state.

Another example is a TSFM_SIZE_8×8_FLAG_PB syntax element after a CBP_CHROMA state in the H.264 standard. Four binary values generally exist for the CBP_LUMA state and at least one binary value for a CBP_CHROMA state. Therefore, the 3 context variables for the TSFM_SIZE_8×8_FLAG_PB syntax element may be prefetched in a third cycle of the CBP_LUMA state, because the third cycle is two cycles before the TSFM_SIZE_8×8_FLAG_PB state. However, before decoding a first binary of the CBP_CHROMA state, an existence of a second CBP_CHROMA binary value may be unknown. Therefore, in the third cycle of the CBP_LUMA state, the 4 context variables for the second CBP_CHROMA binary may be prefetched for a total of 7 context variables. To account for the situation where only 6 buffer slots are available, no context variables may be prefetched in the second cycle of the CBP_LUMA state and thus 4 buffer slots remain free from the CBP_LUMA state until the TSFM_SIZE_8×8_FLAG_PB state. The 3 context variables for the TSFM_SIZE_8×8_FLAG_PB state may be prefetched a cycle earlier.

Context variables prefetched at the same time generally reside in the same data word of the circuit 140 and may be read in a single cycle. In the incremental inspection process, each cycle generally appears to prefetch fewer context variables than the width of the circuit 140 and the signal PCV. However, a single context variable may be prefetched in two different states and each time together with different context variables. When putting the context variables together in the data words, the count may exceed the width of the data words. In such situations, either a wait state may be inserted while multiple data words are fetched or prefetching may be started earlier. Each context variable may be assigned to a fixed buffer slot in the circuit 144 independent of which state prefetches the context variable. Such assignments generally help to simplify the control logic in the circuits 138, 142 and/or 146.

In a CABAC decoder (e.g., the circuit 104), the current state may also determine the address used to read the context variables from the circuit 140. However, the address conveyed by the signal PF may not always be for the immediate next context variable. The prefetch address generally encompasses the context variables that may be used in the future, typically N (e.g., 2) cycles after the current cycle, because the latency of the memory system is generally N cycles. In some embodiments, the prefetching may start earlier than the N cycles to account for bus width constraints.

The context variable data is generally available at the output port of the circuit 140 a few (e.g., 2) cycles after the address has been received. Some of the prefetched context variables may not be used directly by the circuit 130 to decode a current binary value. Therefore, the prefetched context variables may be stored in the buffer slots of the circuit 144 for future reference. In some embodiments, the assignments of the context variables to the buffer slots may be arbitrary, so long as the assignments do not overwrite other context variables that are still in use. Other embodiments may provide constant assignments of the context variables to the buffer slots to simplify hardware implementation.

When the time comes to a point (or cycle) where the buffered context variables are to be used, a fixed mapping between the context variables and the slot numbers may simplify a design of the circuit 146 since each context variable is in a known buffer slot. Once the context variables have been transferred in the signal CONTEXTVAR, the arithmetic decoding performed in the circuit 130 generally follows the procedure defined in the corresponding video standard.

When the arithmetic decoding updates a context variable, two possible cases are generally considered. In one case, the updated context variable is to be used again soon. For example, a single HEVC coding unit may contain 4 consecutive syntax elements of the type intra_luma_prediction_mode. The syntax elements may be decoded back-to-back using the same context variable. In such a case, the circuit 130 generally writes the updated data back into the buffer slot via the signal UPDATE. In another case, the context variable may not to be used again any time soon. For example, a context variable may not be used again until a subsequent next code tree block (e.g., CTB) is considered. Therefore, an eviction may be performed and the updated context variables may be written directly to the circuit 140 via the signal UPDATE.

The apparatus 100 may also implement a CABAC encoder. By buffering some or all of one or more macroblocks or coding tree blocks, the next possible states may be predicted (or determined) by the circuit 104. Therefore, the context variables of the next possible states may be prefetched from the circuit 140 to the buffer slots in the circuit 144. In a next cycle, an arithmetic encoder generally has quick access to the appropriate context variables based on the encoded binary value determined in the current cycle.

The functions performed by the diagrams of FIGS. 2-4 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a memory configured to store a plurality of context variables; and
   a circuit configured to (i) generate a select signal that identifies a prediction of a plurality of next states in each of a plurality of next cycles that follow a current cycle of an arithmetic decode of an input signal, (ii) generate a prefetch signal in said current cycle in response to said select signal, (iii) prefetch in parallel from said memory two or more of said context variables suitable to use in said next states in two or more of said next cycles based on said prefetch signal and (iv) generate an output signal by decoding said input signal based on said two or more of said context variables.

2. The apparatus according to claim 1, wherein one or more of said context variables is stored in said memory simultaneously at two or more different addresses.

3. The apparatus according to claim 1, wherein said circuit is further configured to load said two or more of said context variables prefetched from said memory into a buffer based on said select signal.

4. The apparatus according to claim 3, wherein a number of said context variables held in said buffer hides a latency to read said context variables from said memory.

5. The apparatus according to claim 3, wherein said circuit is further configured to read a selected one or more of said context variables from said buffer based on said select signal.

6. The apparatus according to claim 3, further comprising a load logic configured to route each of said context variables read in parallel from said memory to a plurality of respective slots in said buffer.

7. The apparatus according to claim 3, wherein said circuit is further configured to write an updated context variable directly into said buffer.

8. The apparatus according to claim 1, wherein a plurality of said context variables are stored in each of a plurality of data words in said memory.

9. The apparatus according to claim 1, wherein said circuit is further configured to write an updated context variable directly into said memory.

10. The apparatus according to claim 1, wherein said memory and said circuit form part of a camera.

11. A method for an arithmetic decode with low latency, comprising the steps of:
    storing a plurality of context variables in a memory;
    generating a select signal that identifies a prediction of a plurality of next states in each of a plurality of next cycles that follow a current cycle of said arithmetic decode of an input signal;
    generating a prefetch signal in said current cycle in response to said select signal;
    prefetching in parallel from said memory two or more of said context variables suitable to use in said next states in two or more of said next cycles based on said prefetch signal; and generating an output signal by decoding said input signal in response to said two or more of said context variables.

12. The method according to claim 11, wherein one or more of said context variables is stored in said memory simultaneously at two or more different addresses.

13. The method according to claim 11, further comprising the step of:

loading said two or more of said context variables prefetched from said memory into a buffer based on said select signal.

14. The method according to claim 13, wherein a number of said context variables held in said buffer hides a latency to read said context variables from said memory.

15. The method according to claim 13, further comprising the step of:

reading a selected one or more of said context variables from said buffer based on said select signal.

16. The method according to claim 13, further comprising the step of:

routing each of said context variables read in parallel from said memory to a plurality of respective slots in said buffer.

17. The method according to claim 13, further comprising the step of:

writing an updated context variable directly into said buffer.

18. The method according to claim 11, wherein a plurality of said context variables are stored in each of a plurality of data words in said memory.

19. The method according to claim 11, further comprising the step of:

writing an updated context variable directly into said memory.

20. The method according to claim 11, further comprising the step of:

identifying a selected one of said next states used after said current cycle based on a current binary value decoded in said current cycle, wherein a prediction in a subsequent cycle after said next cycles is in response to said selected next state.

* * * * *